United States Patent

Song et al.

[11] Patent Number: 5,886,757
[45] Date of Patent: Mar. 23, 1999

[54] LIQUID CRYSTAL DISPLAY DEVICE AND METHOD FOR FABRICATING THE SAME

[75] Inventors: In Duk Song, Kyungsangbuk-do; Chang Ho Oh, Kyungki-do, both of Rep. of Korea

[73] Assignee: LG Electronics Inc., Seoul, Rep. of Korea

[21] Appl. No.: 948,320

[22] Filed: Oct. 10, 1997

[30] Foreign Application Priority Data

Oct. 11, 1996 [KR] Rep. of Korea .................. 1996/45262

[51] Int. Cl.⁶ ....................................................... G02F 1/136
[52] U.S. Cl. ................................. 349/43; 257/59; 257/72
[58] Field of Search .......................... 349/42, 43; 257/59, 257/72

[56] References Cited

U.S. PATENT DOCUMENTS 5,528,055  6/1996  Komori et al. ........................... 257/72
5,712,494  1/1998  Akiyama et al. ......................... 257/59

*Primary Examiner*—William L. Sikes
*Assistant Examiner*—Tiep H. Nguyen

[57] ABSTRACT

A liquid crystal display (LCD) device and a method of fabricating the same with improved on-current characteristic and reduced parasitic capacitance are disclosed. The LCD device includes a plurality of gate lines and data lines formed on a substrate, a plurality of pixel electrodes formed at regions defined by the gate and data lines, and a plurality of thin film transistors formed at the cross-over points of the gate and data lines, wherein each of the thin film transistors includes a gate electrode extending from the corresponding gate line, a drain electrode connected to the corresponding pixel electrode, and a source electrode extending from the corresponding data line and having a width greater than the width of the drain electrode. The method includes the steps of forming a gate electrode extending from a gate line, forming a drain electrode connected to a pixel electrode, and forming a source electrode extending from a data line and having a width greater than the width of the drain electrode.

25 Claims, 2 Drawing Sheets

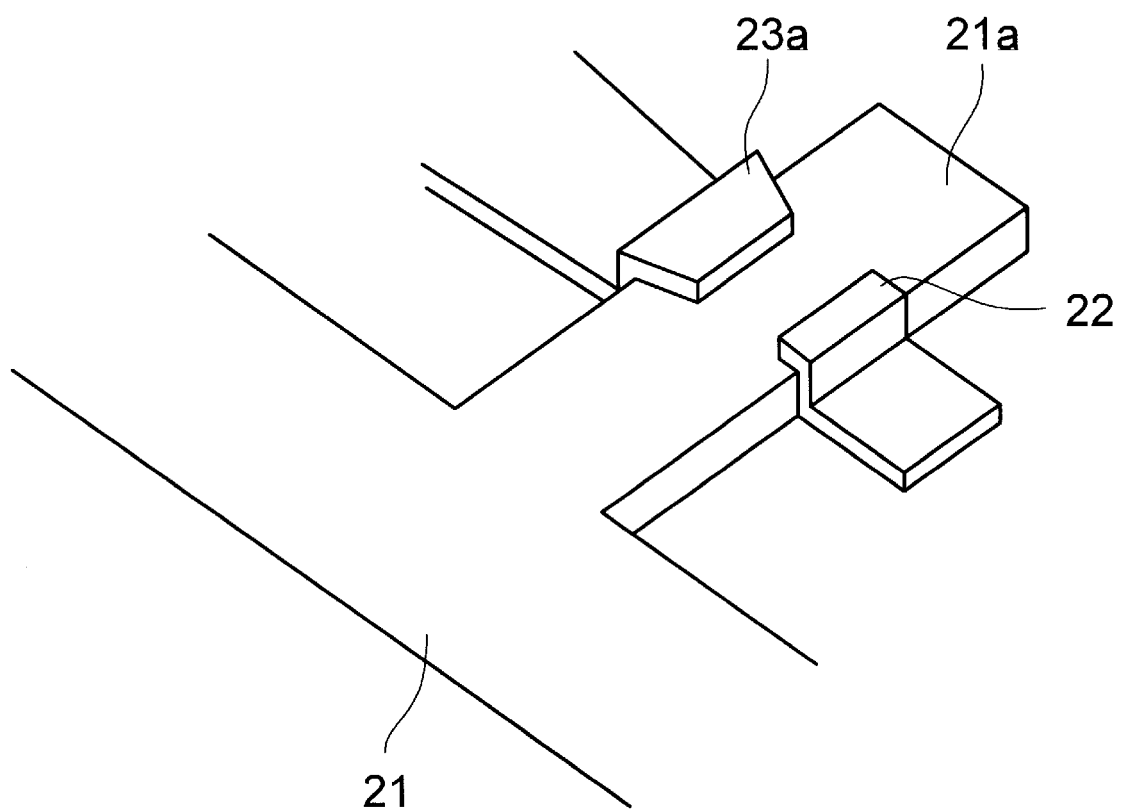

LIQUID CRYSTAL DISPLAY DEVICE AND METHOD FOR FABRICATING THE SAME

BACKGROUND OF THE INVENTION

1. Field of the Invention

The present invention relates to a liquid crystal display (LCD) device and more particularly, to a thin film transistor (TFT) of a liquid crystal display device and a method of fabricating the same, which improves the on-current characteristic of the LCD device and reduces parasitic capacitance by adjusting a width of an electrode of the LCD device.

2. Discussion of the Related Art

Generally, an LCD device includes top and bottom glass plates, and a liquid crystal injected therebetween. On the bottom glass plate, a plurality of gate lines extending in one direction and a plurality of data lines extending in another direction perpendicular to the gate lines are formed. In this matrix arrangement, a plurality of TFTs and a plurality of pixel electrodes are disposed at the cross-over points of the data and gate lines.

On the top glass plate, red (R), green (G) and blue (B) color filter layers and a common electrode are disposed. Generally, a light shielding layer (black matrix) is formed on the top glass plate and a pair of polorizers are disposed on the outer surfaces of the top and bottom glass plates to selectively transmit light.

A conventional LCD device will be described below with reference to FIG. 1 which shows a layout of a conventional LCD device.

As illustrated in FIG. 1, the conventional LCD device includes a plurality of gate lines 1 formed on a transparent substrate, a plurality of data lines 2 crossing the gate lines 1, a plurality of TFTs 5 formed at the cross-over points of the gate and data lines 1 and 2, and a plurality of pixel electrodes 3 connected to the TFTs 5. The gate lines 1 are separated by certain intervals and extend in one direction, whereas the data lines 2 are separated by certain intervals and extend perpendicular to the gate lines 1. Two adjacent gate lines 1 and two adjacent data lines 2 crossing the gate lines 1, define the boundaries of a pixel region. In each pixel region, the TFT 5 and the pixel electrode 3 are disposed.

Each of the TFTs 5 includes a gate electrode 1a, a source electrode 2a, and a drain electrode 4. A gate insulating layer is formed between the gate and source electrodes 1a and 2a and between the gate and drain electrodes 1a and 4. The gate electrode 1a extends from the gate line 1 and the source electrode 2a extends from the data line 2. The drain electrode 4 connects the gate electrode 1a and the pixel electrode 3.

The TFT 5 transmits a signal of the data line 2 to the pixel electrode 3 in response to a signal of the gate line 1. The source electrode 2a and the drain electrode 4 have the same width (a).

In the conventional LCD device having the above-described TFTS, if a signal voltage is applied to the gate electrode 1a, the TFT is turned on so as to transmit a data voltage representing picture data to the pixel electrode 3 and the liquid crystal..

Given that a current required to charge the liquid crystal is known as the "on-current", $I_{ON}$, a general expression of $I_{ON}$ is as follows:

$$I_{on} = \frac{C_{TOT} \times V_{LC}}{\tau_g} \quad (1)$$

where $\tau_g$ is a gate turn-on time, $C_{TOT}$ is a total capacitance of the liquid crystal and an auxiliary capacitor, and $V_{LC}$ is a voltage applied to the liquid crystal.

On the other hand, there are cross-over portions where the gate electrode 1a overlaps with the source electrode 2a and the drain electrode 3. In this case, the cross-over portions have parasitic capacitance of $C_{gs}$ and $C_{gd}$, where $C_{gs}$ is the gate-source capacitance and $C_{gd}$ is the gate-drain capacitance.

When the TFT is turned off, the voltage on the pixel drops as much as an amount $\Delta V_p$ due to capacitive coupling. The drop amount $\Delta V_p$ can be expressed as follows:

$$\Delta V_P = \frac{C_{gs}}{C_{gs} + C_{LC} + C_{st}} * V_g \quad (2)$$

where $C_{gs}$ is the gate-source capacitance, $C_{LC}$ is the pixel capacitance, $C_{st}$ is the storage capacitance, and $V_g$ is the gate voltage. $\Delta V_p$ also adds to the deterioration in the picture quality of the LCD device. Therefore, in order to improve picture quality, it is important to minimize $\Delta V_p$ and improve on the on-current characteristics of the LCD device.

However, the conventional LCD device includes source and drain electrodes having the same width. Such a structure neither improves the on-current characteristic nor reduces parasitic capacitance. Therefore, the conventional LCD suffers from a deteriorating picture quality.

SUMMARY OF THE INVENTION

Accordingly, the present invention is directed to an LCD device and a method for fabricating the same that substantially obviates one or more of the problems due to limitations and disadvantages of the related art.

An object of the present invention is to provide an LCD device and a method for fabricating the same, in which a width of a source electrode is greater than that of a drain electrode of a TFT so as to improve the on-current characteristic of the LCD device and reduce its parasitic capacitance.

Another object of the present invention is to provide an LCD device and a method for fabricating the same, in which a source electrode has a trapezoidal shape for improving the on-current and reducing parasitic capacitance.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purposes of the present invention, as embodied and broadly described, an LCD device according to the embodiments of the present invention includes a plurality of gate lines and data lines formed on a substrate, a plurality of pixel electrodes formed at regions defined by the gate and data lines, a liquid crystal and a color filter layer formed over the pixel electrodes, a gate electrode extending from one of the gate lines, a drain electrode connected to one of the pixel electrodes, and a source electrode extending from one of the data lines and having a width greater than a width of the drain electrode.

In one aspect, the embodiments of the present invention are directed to a thin film transistor (TFT) for a liquid crystal display (LCD) device including a plurality of gate and data lines formed on a substrate, and a plurality of pixel electrodes formed at regions defined by the gate and data lines, the TFT comprising a gate electrode extending from one of the gate lines; a drain electrode connected to one of the pixel electrodes; and a source electrode extending from one of the data lines and having a width greater than a width of the drain electrode.

In another aspect, the embodiments of the present invention are directed to a method for fabricating a liquid crystal display (LCD) device having a plurality of gate lines and data lines formed on a substrate, a plurality of pixel electrodes formed at regions defined by the gate and data lines, and a liquid crystal and a color filter layer formed over the pixel electrodes, the method comprising the steps of forming a gate electrode extending from one of the gate lines; forming a drain electrode connected to one of the pixel electrodes; and forming a source electrode extending from one of the data lines and having a width greater than a width of the drain electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 3 is a perspective view of "A" portion of FIG. 2.

DETAILED DESCRIPTION OF THE PREFERRED EMBODIMENTS

Reference will now be made in detail to the preferred embodiments of the present invention, examples of which are illustrated in the accompanying drawings.

Figure 1:
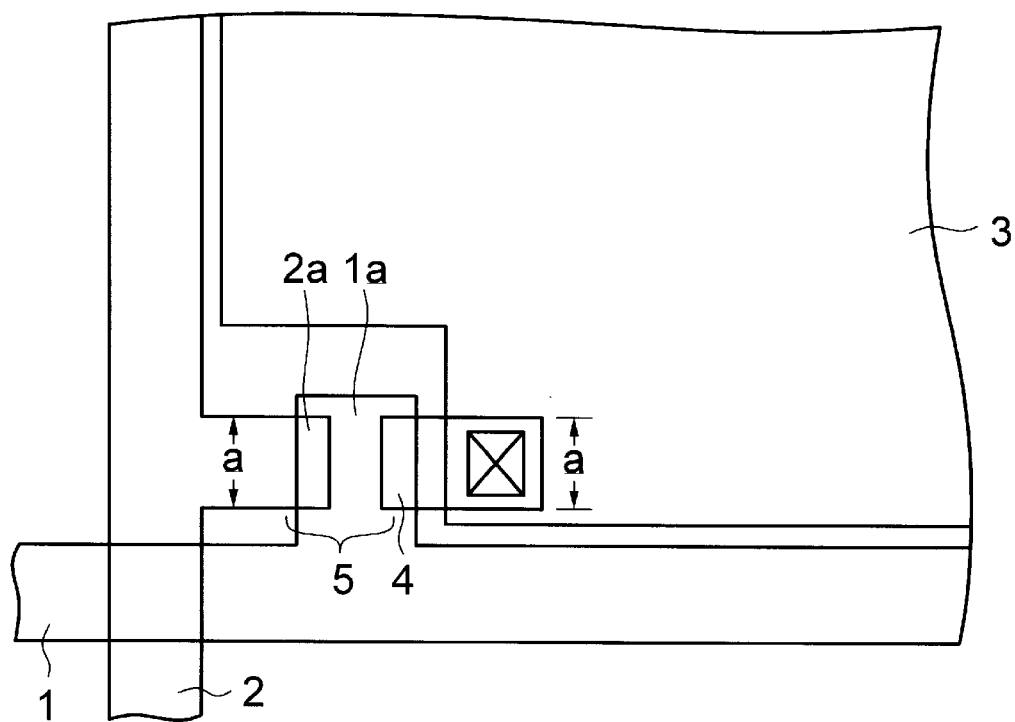
FIG. 1 is a layout illustrating a conventional LCD device.
Figure 2:
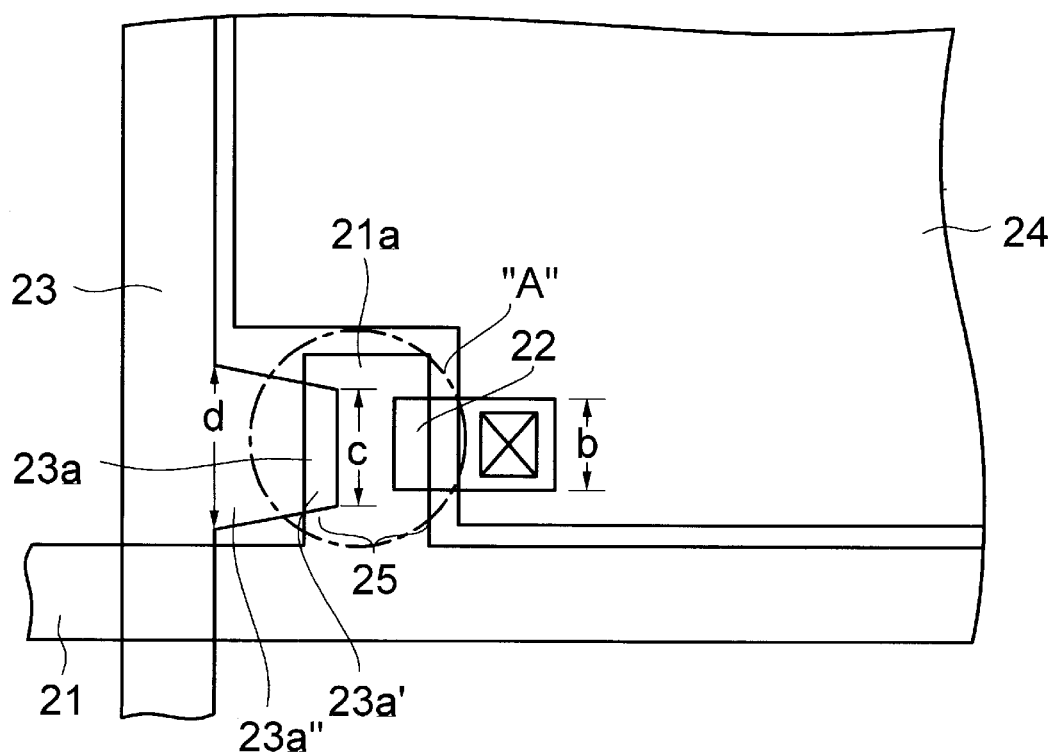
Fig. 2 is a layout illustrating an LCD device according to the embodiments of the present invention.

As illustrated in FIG. 2, a liquid crystal display (LCD) device according to the embodiments of the present invention includes a plurality of gate lines 21 disposed in parallel on a transparent substrate, a plurality of data lines 23 extending in a direction perpendicular to the gate lines 21, a plurality of thin film transistors (TFTs) 25 formed at cross-over points of the gate and data lines 21 and 23, and a plurality of pixel electrodes 24 connected to the TFTs 25. The LCD devices further includes other components, e.g., insulators, liquid crystal, color filters, polarizers, etc., which are present in conventional LCDs.

Each of the TFTs 25 includes a gate electrode 21a extending from the corresponding gate line 21, a drain electrode 22 which overlaps the gate electrode 21a, and a source electrode 23a extending from the corresponding data line 23. The source electrode 23a has a top width (c) and a bottom width (d) which is greater than the top width (c). That is, the source electrode 23a has a trapezoidal shape so that the width of the source electrode 23a increases gradually from the top portion to 23a the bottom portion 23a of the source electrode 23a. On the other hand, the drain electrode 22 has one width (b). The width (b) of the drain electrode 22 is less than the top width (c) of the source electrode 23a.

The above-described structure of the source electrode 21a minimizes the amount $\Delta V_p$ and improves the on-current characteristic of the LCD device. According to Equation (2) described hereinabove, the present structure of the source electrode 21a decreases the value of $C_{gs}$ which decreases $\Delta V_p$ and the parasitic capacitance. Therefore, the LCD device prevents deterioration of picture quality.

FIG. 3 is a perspective view of "A" portion of FIG. 2, which shows the source electrode 23a and the drain electrode 22 both overlapping the gate electrode 21a.

A method of fabricating the above-described LCD device according to the embodiments of the present invention will be described below.

The gate electrode 21a is patterned at a predetermined portion on the transparent substrate. The gate electrode 21a extends from the corresponding gate line 21. A gate insulating layer is then formed on the entire surface of the transparent substrate and the gate electrode 21a. A semiconductor layer is formed on the gate insulating layer and patterned.

Subsequently, a source and drain electrode material is deposited on the semiconductor layer and patterned to form the source electrode 23a, the drain electrode 22, and the data line 23. Particularly, the source electrode 23a as patterned has a trapezoidal (or a ladder) shape having a width greater than the width (b) of the drain electrode 22.

The gate insulating layer, the semiconductor layer and $n^+$layer (not shown) are formed between the source electrode 23a and the gate electrode 21a and between the drain electrode 22 and the gate electrode 21a. Other elements and components of the LCD device are formed in a manner similar to the way a conventional LCD device is formed.

As described hereinabove, the LCD device and the method for fabricating the same have many advantages including the following.

Since the source electrode has a width (top or bottom width) greater than the width of the drain electrode, it is possible to reduce parasitic capacitance and increase on-current, thereby improving picture quality as well as step coverage of the LCD device.

It will be apparent to those skilled in the art that various modifications and variations can be made in the LCD device and the method for fabricating the same according to the present invention without departing from the spirit or scope of the invention.

Thus, it is intended that the present invention cover the modifications and variations of the invention, provided they come within the scope of the appended claims and their equivalents.

What is claimed is:

1. A thin film transistor (TFT) for a liquid crystal display (LCD) device including a plurality of gate and data lines formed on a substrate, and a plurality of pixel electrodes formed at regions defined by the gate and data lines, the thin film transistor comprising:

a gate electrode extending from one of the gate lines;

a drain electrode connected to one of the pixel electrodes; and a source electrode extending from one of the data lines and having a width greater than a width of the drain electrode, wherein the source electrode has a bottom width which is greater than a top width of the source electrode.

2. The thin film transistor as claimed in claim 1, wherein the source electrode has a trapezoidal configuration.

3. The thin film transistor as claimed in claim 2, wherein a middle portion of the source electrode is aligned with a middle portion of the drain electrode.

4. The thin film transistor as claimed in claim 1, wherein the source electrode is shaped so that the width of the source electrode gradually increases from the top portion to the bottom portion of the source electrode.

5. The thin film transistor as claimed in claim 1, wherein the source and drain electrodes overlap portions of the gate electrode.

6. A liquid crystal display (LCD) device including a plurality of gate lines and data lines formed on a substrate, a plurality of pixel electrodes formed at regions defined by the gate and data lines, and a liquid crystal and a color filter layer formed over the pixel electrodes, the LCD device comprising:

a gate electrode extending from one of the gate lines;

a drain electrode connected to one of the pixel electrodes; and a source electrode extending from one of the data lines and having a width greater than a width of the drain electrode, wherein the source electrode has a bottom width which is greater than a top width of the source electrode.

7. The LCD device as claimed in claim 6, wherein the source electrode has a trapezoidal configuration.

8. The LCD device as claimed in claim 7, wherein a middle portion of the source electrode is aligned with a middle portion of the drain electrode.

9. The LCD device as claimed in claim 6, wherein the width of the source electrode gradually increases from its top portion to its bottom portion.

10. The LCD device as claimed in claim 6, wherein the source and drain electrodes overlap portions of the gate electrode.

11. A method for fabricating a liquid crystal display (LCD) device having a plurality of gate lines and data lines formed on a substrate, a plurality of pixel electrodes formed at regions defined by the gate and data lines, and a liquid crystal and a color filter layer formed over the pixel electrodes, the method comprising the steps of:

forming a gate electrode extending from one of the gate lines;

forming a drain electrode connected to one of the pixel electrodes; and forming a source electrode extending from one of the data lines and having a width greater than a width of the drain electrode, wherein the source electrode has a bottom width which is greater then the top width of the source electrode.

12. The method as claimed in claim 11, further comprising the steps of:

forming an insulating layer on the gate electrode; and forming a semiconductor layer on the insulating layer.

13. The method as claimed in claim 12, wherein the step of forming a source electrode includes the step of:

patterning the source electrode to have a trapezoidal shape.

14. The method as claimed in claim 12, wherein step of forming a source electrode further includes the step of:

aligning a middle portion of the source electrode with a middle portion of the drain electrode.

15. The method as claimed in claim 11, wherein the width of the source electrode gradually increases from its top portion to its bottom portion.

16. The method as claimed in claim 11, wherein the source and drain electrodes overlap portions of the gate electrode.

17. A thin film transistor (TFT) for a liquid crystal display (LCD) device including a plurality of gate lines and data lines formed on a substrate, and a plurality of pixel electrodes formed on the substrate, the TFT comprising:

a gate electrode extending from one of the gate lines;

a drain electrode connected to one of the pixel electrodes; and a source electrode extending from one of the data lines, the source electrode having a bottom width which is greater than a top width of the source electrode.

18. A thin film transistor as claimed in claim 17, wherein the width of the source electrode gradually increases from a top portion to a bottom portion of the source electrode.

19. A thin film transistor as claimed in claim 17, wherein the width of the source electrode is greater than the width of the drain electrode.

20. A liquid crystal display (LCD) device comprising:

a plurality of gate lines and data lines and pixel electrodes formed on a substrate; and a plurality of thin film transistors coupled to the plurality of gate lines and data lines each of the transistors including a gate electrode extending from one of the gate lines, a drain electrode connected to one of the pixel electrodes, and a source electrode extending from one of the data lines and having a bottom width which is greater than a top width of the source electrode.

21. The LCD device as claimed in claim 20, wherein the width of the source electrode gradually increases from a top portion to a bottom portion of the source electrode.

22. The LCD device as claimed in claim 21, wherein the width of the source electrode is greater than the width of the drain electrode.

23. A method for forming a liquid crystal display (LCD) device having a plurality of gate lines and data lines and a plurality of pixel electrodes formed on a substrate, the method comprising the steps of:

forming a gate electrode extending from one of the gate lines;

forming a drain electrode connected to one of the pixel electrodes; and forming a source electrode extending from one of the data lines and having a bottom width which is greater than a top width of the source electrode.

24. The method as claimed in claim 23, wherein in said step of forming a source electrode, the width of the source electrode gradually increases from a top portion to a bottom portion of the source electrode.

25. The method as claimed in claim 24, wherein in said step of forming a source electrode, the width of the source electrode is greater than the width of the drain electrode.

* * * * *